US006552323B2

(12) United States Patent
Guidash et al.

(10) Patent No.: US 6,552,323 B2
(45) Date of Patent: Apr. 22, 2003

(54) IMAGE SENSOR WITH A SHARED OUTPUT SIGNAL LINE

(75) Inventors: Robert M. Guidash, Rochester, NY (US); Timothy J. Kenney, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 77 days.

(21) Appl. No.: 09/731,372

(22) Filed: Dec. 6, 2000

(65) Prior Publication Data

US 2002/0066849 A1 Jun. 6, 2002

(51) Int. Cl.[7] .............................................. H01L 27/00
(52) U.S. Cl. ..................... 250/208.1; 257/444
(58) Field of Search ......................... 250/208.1, 214 R, 250/214 LS; 348/302, 307, 308, 309, 310; 257/443, 444, 445

(56) References Cited

U.S. PATENT DOCUMENTS 5,949,061 A     9/1999  Guidash et al. ............ 250/208.1
6,160,281 A  * 12/2000  Guidash ..................... 257/292
6,246,042 B1 *  6/2001  Szydlowski ............... 250/208.1

* cited by examiner

Primary Examiner—Robert H. Kim
Assistant Examiner—Hoon K. Song
(74) Attorney, Agent, or Firm—Peyton C. Watkins

(57) ABSTRACT

An image sensor comprises a plurality of pixels arranged in rows and columns; at least two adjacent pixels in the same row each having a photodetector; a row select mechanism that allows independent selection of the adjacent pixels; and a common output signal node and output signal line for the two adjacent pixels.

7 Claims, 8 Drawing Sheets

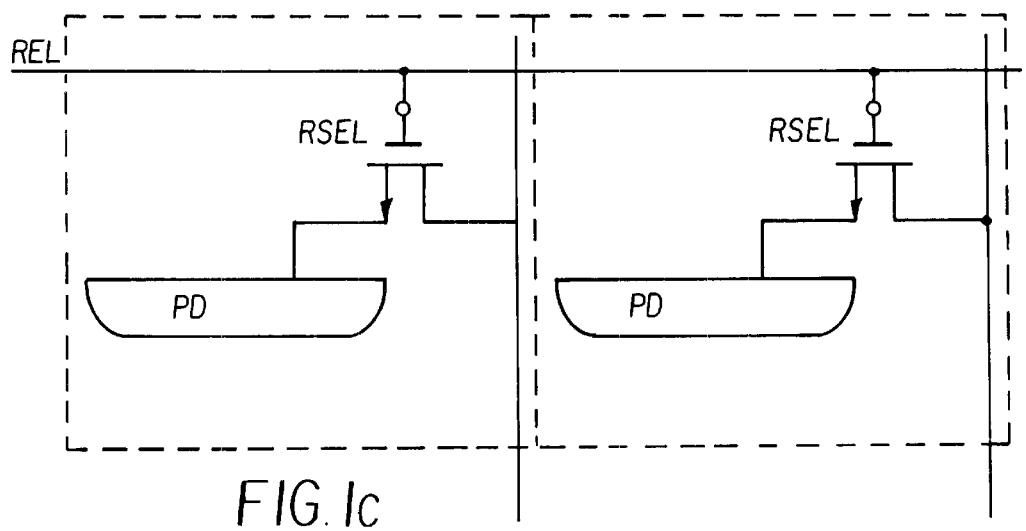
FIG. lc
(Prior Art)
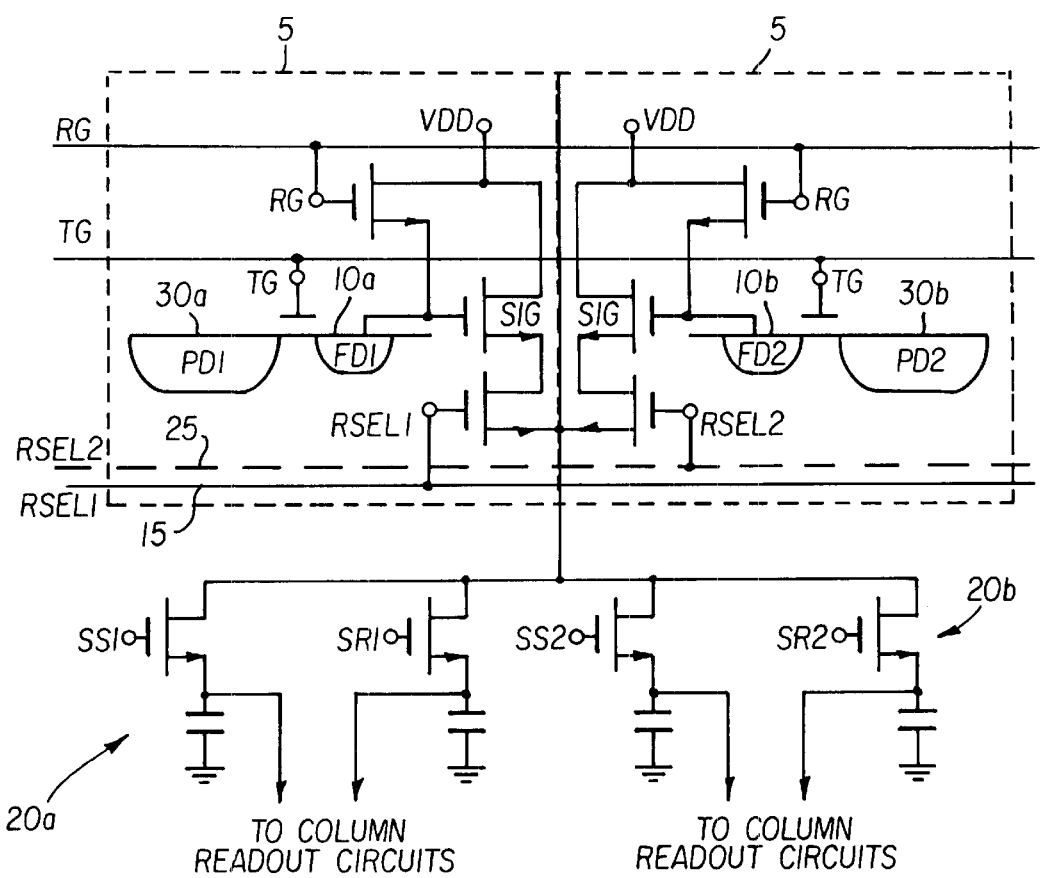
FIG. 2a

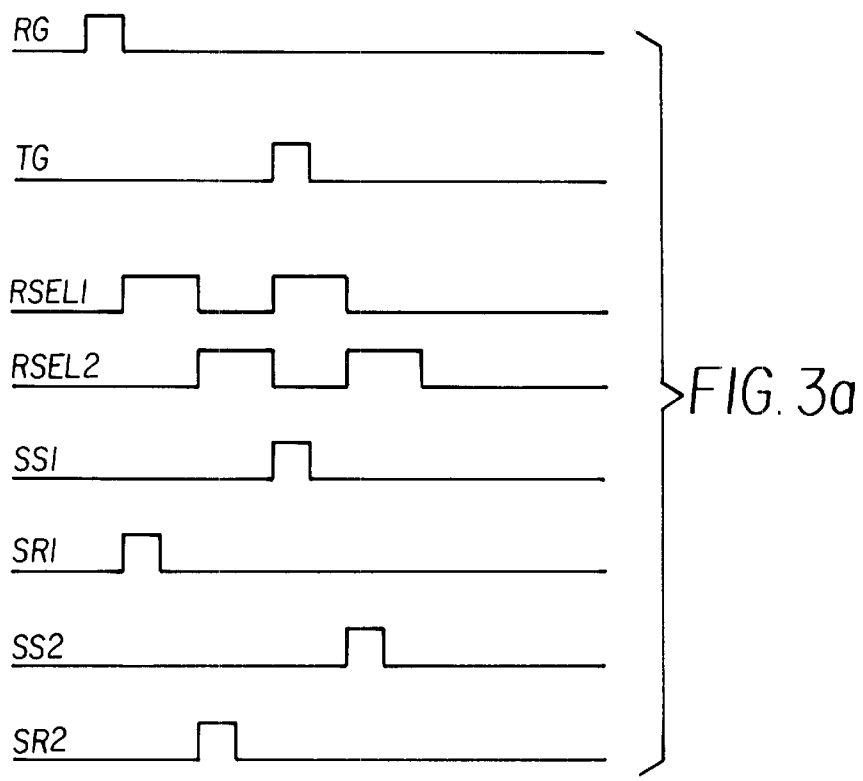
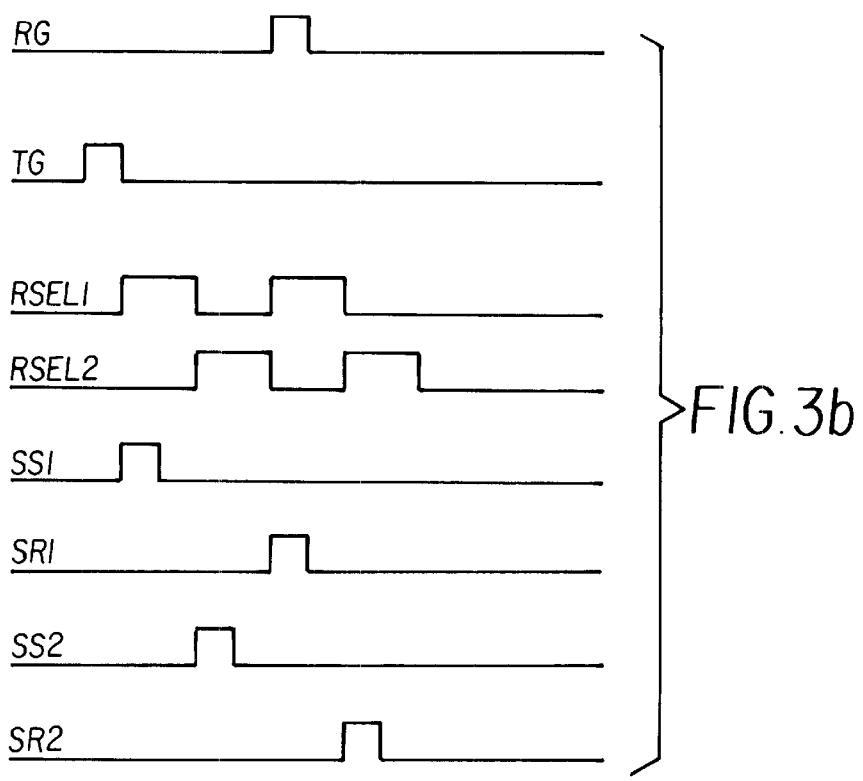

IMAGE SENSOR WITH A SHARED OUTPUT SIGNAL LINE

FIELD OF THE INVENTION

The present invention relates to image sensing devices and, more particularly, to image sensing devices that provide for either smaller pixel sizes or increased pixel fill factor.

BACKGROUND OF THE INVENTION

Active Pixel Sensors (APS) typically include a photo-sensing means with associated active circuitry elements allocated for pixels on an individual basis. These active circuitry elements typically are means to perform a pixel reset function, or some means to transfer charge, means to perform a voltage conversion, or circuitry elements used in amplification. APS devices have been operated in a manner where each line or row of the imager is selected and then read out using a column select signal (analogous to a word and bit line in memory devices respectively). Prior art devices have been disclosed in which all of these components have been located entirely within a single pixel boundary.

Inclusion of these active circuit element components in each pixel reduces the fill factor for the pixel because it takes up area that could otherwise be used for the photodetector. This reduces the sensitivity and saturation signal of the sensor which, in turn, adversely affect the photographic speed and dynamic range of the sensor, performance parameters that are critical to obtaining good image quality. Additionally, inclusion of these active circuit elements within the pixel places a limitation on the minimum size of the pixel, which adversely affects the size and cost of the image sensor.

In order to build high resolution, small pixel APS devices, it is necessary to use sub-tem CMOS processes in order to minimize the area of the pixel allocated to the row select transistor and other parts of the amplifier in the pixel. In essence, it takes a more technologically advanced and more costly process to realize the same resolution and sensitivity APS device when compared to a standard charge coupled device (CCD) sensor. However, APS devices have the advantages of single supply operation, lower power consumption, x-y addressability, image windowing and the ability to effectively integrate signal processing electronics on-chip, when compared to CCD sensors.

One approach to providing an image sensor with the sensitivity of a CCD and the advantages of an APS device, is to improve the fill factor and sensitivity of an APS device by reducing the number of components and interconnect required entirely within a single pixel while maintaining the desired features and functionality of the original pixel design. U.S. patent application Ser. No. 08/808,444 by Guidash discloses a means for fulfilling this need. In this case, the floating diffusion, source follower amplifier, row select transistor, and reset transistor were shared between two row adjacent photodetectors and transfer gates. This provided a pixel with improved fill factor, but eliminated the ability to perform a global electronic shutter without the use of an external mechanical shutter.

In view of the foregoing discussion, it should be readily apparent that there remains a need within the prior art for a method and apparatus that increase pixel fill factor and/or reduces pixel size while simultaneously allowing for global shuttering.

SUMMARY OF THE INVENTION

An image sensor comprises (a) a plurality pixels arranged in rows and columns; (b) at least two adjacent pixels in the same row each having a photodetector; (c) a row select mechanism that allows independent selection of the adjacent pixels; and (d) a common output signal node for the two adjacent pixels.

BRIEF DESCRIPTION OF THE DRAWINGS

FIGS. 1a–1c are prior art pixels of an image sensor;

FIGS. 2a–2d are pixels of an image sensor of the present invention;

FIGS. 3a–3b are timing diagrams for FIG. 2a;

DETAILED DESCRIPTION OF THE INVENTION

Figure 1A:
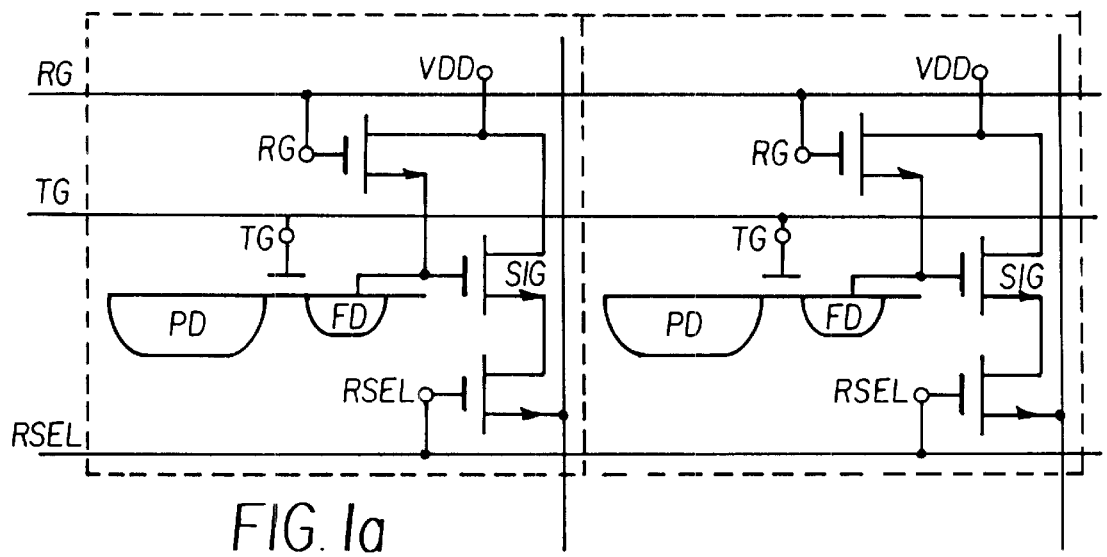
Figure 1B:
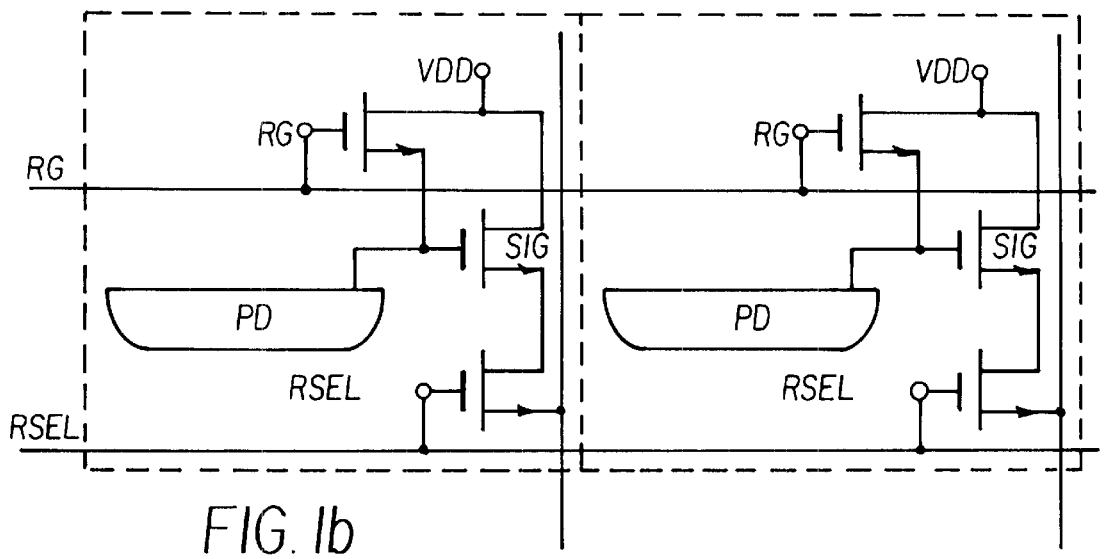

In order to appreciate the present invention, it would be instructive to have an understanding of the prior art. In this regard, some typical prior art Active Pixel Sensors (APS) and Passive Pixel Sensors (PPS) pixels are shown in FIGS. 1a, 1b and 1c. The APS pixel in FIG. 1a comprises a photodetector (PD), that can be either a photodiode or photogate, transfer gate (TG), floating diffusion (FD), reset transistor with a reset gate (RG), row select transistor with a row select gate (RSEL), and signal transistor (SIG). The APS pixel in FIG. 1b comprises a photodetector (PD), typically a photodiode (P), reset transistor with a reset gate (RG), row select transistor with a row select gate (RSEL), and signal transistor (SIG). The PPS pixel in FIG. 1c comprises a photodetector (PD), typically a photodiode (P), and a row select transistor with a row select gate, (RSEL). The operation of the APS and PPS pixels discussed hereinabove are well known in the art and will not be discussed in detail herein. In each case, the inclusion of all of these components within a single pixel reduces the fill factor, sensitivity and minimum size of the pixel.

One means to realize fill factor improvement is to utilize the row at a time read out operation, and provide a floating diffusion and amplifier for two row adjacent pixels instead of each pixel. This was disclosed in U.S. patent application Ser. No. 08/808,444 by Guidash. Since only one row is read out at a time, a single floating diffusion, reset transistor, row select transistor and source follower amplifier can be used for two adjacent pixels that are in separate rows. The disclosure of U.S. patent application Ser. No. 08/808,444, however, cannot perform global electronic shutter without the use of a mechanical shutter to block incident illumination during readout of the sensor.

Figure 2B:
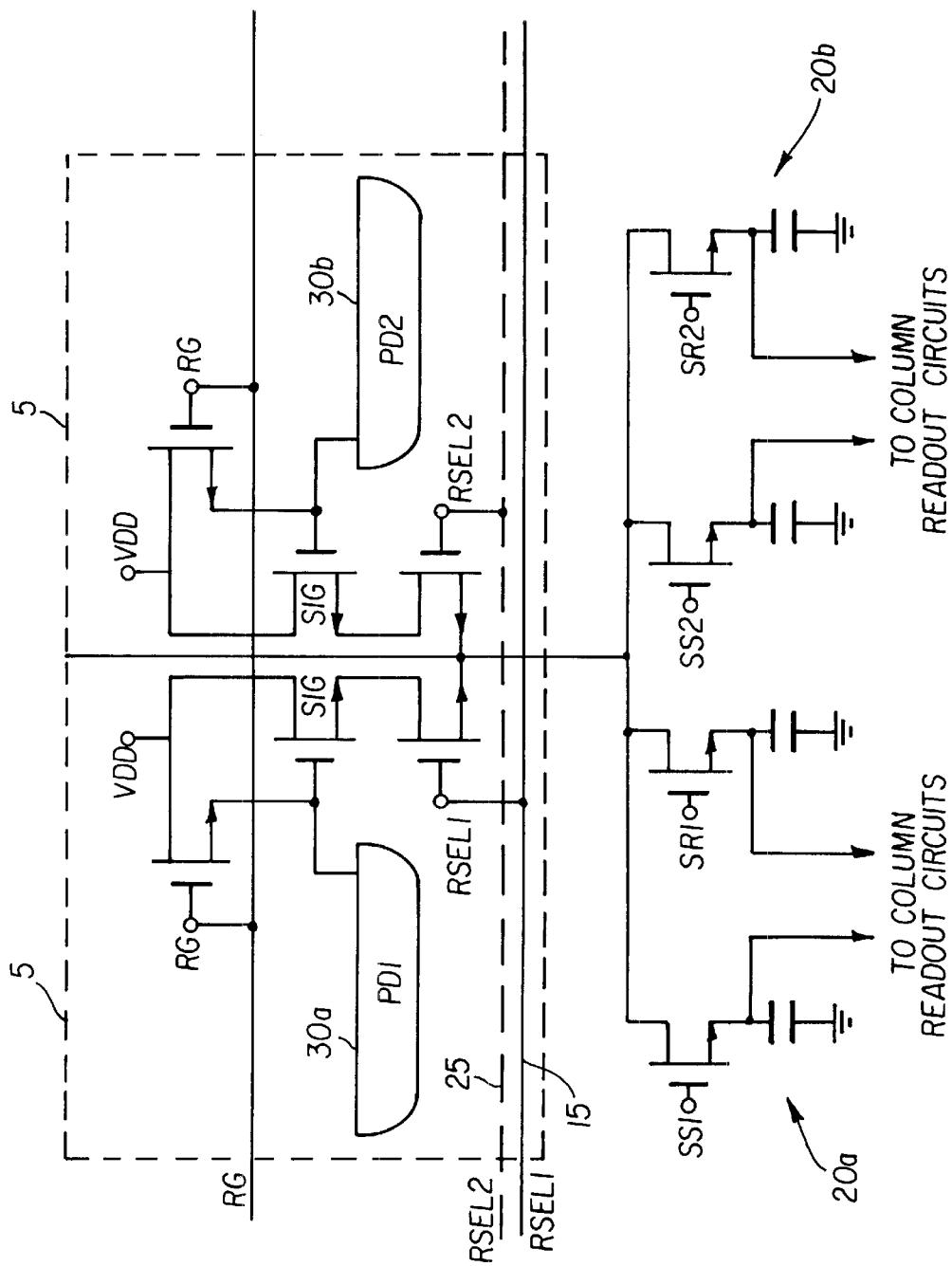
Figure 2C:
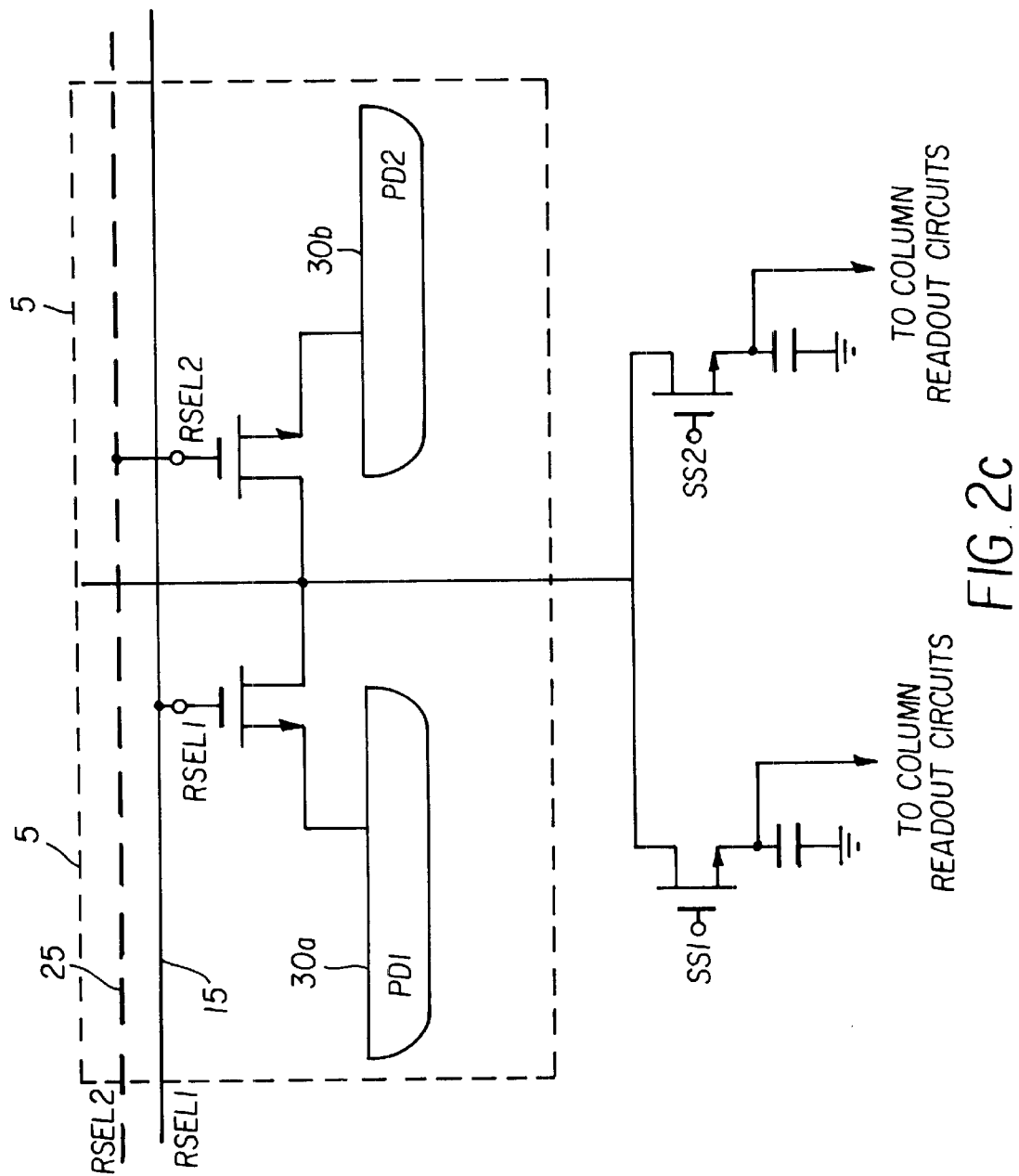

Turning now to the present invention, schematic diagrams of the present invention are shown in FIGS. 2a, 2b and 2c. In general, the present invention shares the pixel output node and output signal line between at least two rows adjacent pixels 5. Image signal separation within a row is achieved by having two separate row select signal lines per row, one for every other pixel within a row, and a 1:2 column output signal line de-mulitplexing scheme for each pair of columns.

The preferred modes of operation are described below. Those skilled in the art will recognize that other modes are possible, and that these are chosen for illustration purposes. Those skilled in art will also recognize that, although only two pixels 5 are shown, each row will include a plurality of pixels 5 and the operation of adjacent pixels 5 will be as described hereinbelow. For the four transistor (4T) pixels shown in FIG. 2a, the readout operation is done in the following manner as shown in FIG. 3a. Referring to both FIGS. 2a and 3a, first, the floating diffusions 10a, 10b are reset by pulsing RG. Next, row select 1 (15) is turned on and the reset level of floating diffusion 1 (10a) is sampled and held by the column circuit 20a by pulsing SR1. It is obvious to those skilled in the art that row select 1 (15) will direct all electrical activities for the pixels to which row select 1 (15) is connected, every other pixel in the present invention. Row select 1 (15) is then turned off and row select 2 (25) is turned on. The reset level of floating diffusion 2 (10b) is then sampled and held by the column circuit 20b by pulsing SR2. Next, the integrated signal charges are transferred from the photodetectors 30 to the floating diffusion by pulsing TG. Row select 2 (25) is turned off and row select 1 (15) is turned on and the signal level of floating diffusion 1 (10a) is sampled and held by column circuit 20a by pulsing SS1. Row select 1 (15) is turned off and row select 2 (25) is turned on and the signal level of floating diffusion 2 (10b) is sampled and held by the column circuit 20b by pulsing SS2. The readout of the sampled and held signals of the column circuits 20a, 20b is then done prior to the same pixel readout scheme commencing in the next row.

The timing in FIG. 3a illustrates the rolling shutter operation of the pixel. The present invention of FIG. 2a can also perform global shutter operation. This is shown in FIG. 3b. In this regard, readout commences by transfer of the integrated signal charge from the photodetectors 30a, 30b to the floating diffusions 10a, 10b in each pixel of the sensor simultaneously. Next, row select 1 (15) is turned on and the signal level of floating diffusion 1 (10a) is sampled and held by the column circuit 20a by pulsing SS1. Row select 1 (15) is then turned off and row select 2 (25) is turned on and the signal level of floating diffusion 2 (10b) is sampled and held by the column circuit 20b by pulsing SS2. The floating diffusions 10a, 10b in the row being readout are then reset by pulsing RG. Next row select 2 (25) is turned off and row select 1 (15) is turned on and the reset level of floating diffusion 1 (10a) is sampled and held by the column circuit 20a by pulsing SR1. Row select 1 (15) is then turned off and row select 2 (25) turned on and the reset level of floating diffusion 2 (10b) is sampled and held by pulsing SR2. The readout of the sampled and held signals of the column circuits 20a, 20b is then done prior to the same pixel readout scheme commencing in the next row of the image sensor.

Figure 4:
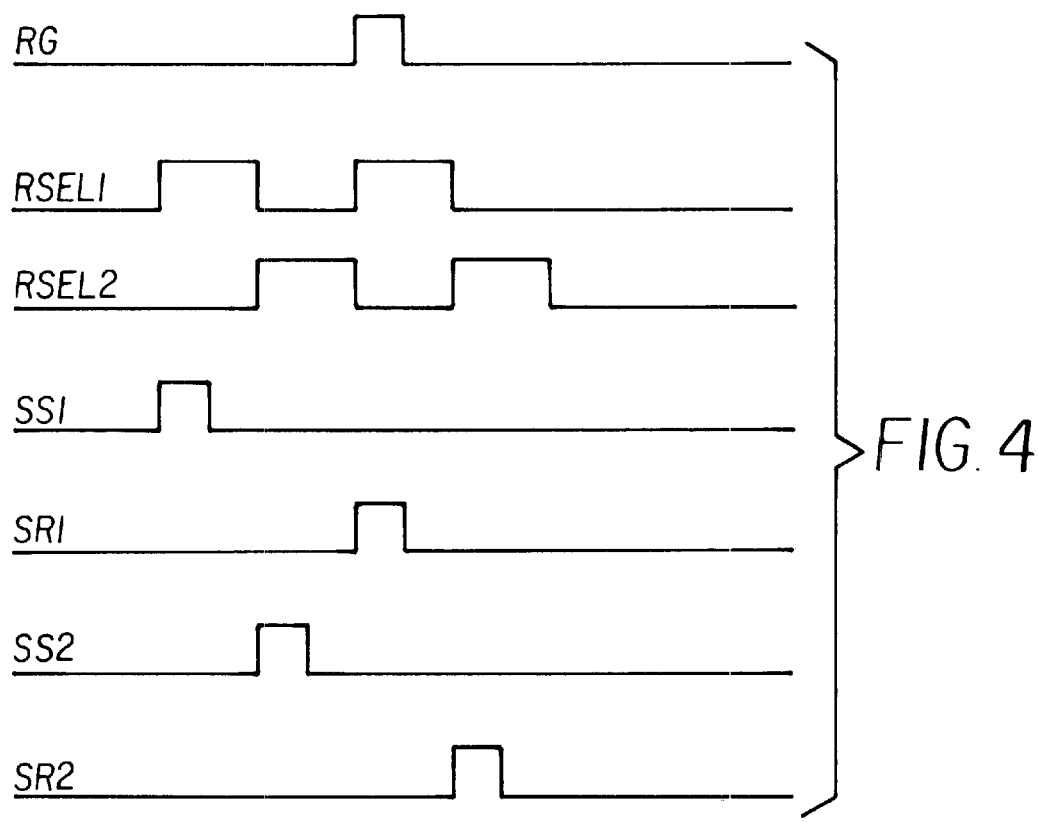
FIG. 4 is a timing diagram for FIG. 2b.

The readout operation of the APS pixel in FIG. 2b is shown in the timing diagram of FIG. 4. At the end of the desired integration time, row select 1 (15) is turned on and the signal level of photodetector 1 (30a) is sampled and held by the column circuit 20a by pulsing SS1. Next, row select 1 (15) is turned off and row select 2 (25) is turned on and the signal level of photodetector 2 (30b) is sampled and held by the column circuit 20b by pulsing SS2. Next, all photodetectors 30a, 30b in the row being readout are reset by pulsing RG. The reset level of photodetector 1 (30a) is sampled and held by the column circuit 20a by turning off row select 2 (25) and turning on row select 1 (15) and pulsing SR1. The reset level of photodetector 2 (30b) is next sampled and held by the column circuit 20a by turning off row select 1 (15) and turning on row select 2 (25) and pulsing SR2. The readout of the sampled and held signals by the column circuits 20a, 20b is then done prior to the same pixel readout scheme commencing in the next row of the image sensor.

Figure 5:
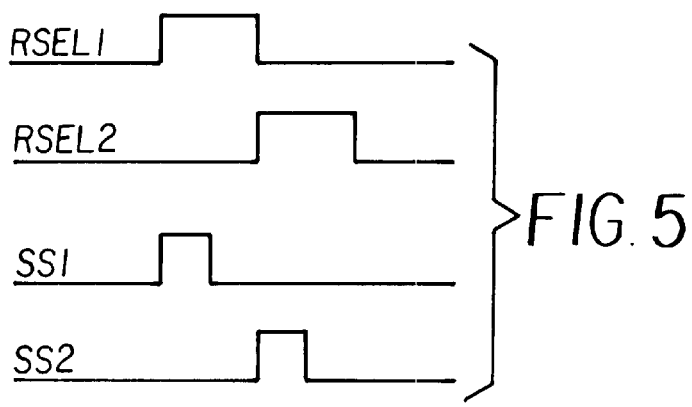
FIG. 5 is a timing diagram for FIG. 2c.

The readout operation of the PPS pixel in FIG. 2c is shown in the timing diagram of FIG. 5. At the end of the desired integration time, row select 1 (15) is turned on and the signal level of photodetector 1 (30a) is sampled and held by the column circuit (not shown) by pulsing SS1 (not shown). Next, row select 1 (15) is turned off and row select 2 (25) is turned on and the signal level of photodetector 2 (30b) is sampled and held by the column circuit (not shown) by pulsing SS2 (not shown). The readout of the sampled and held signals is then done prior to the same pixel readout scheme commencing in the next row of the image sensor.

Figure 2D:
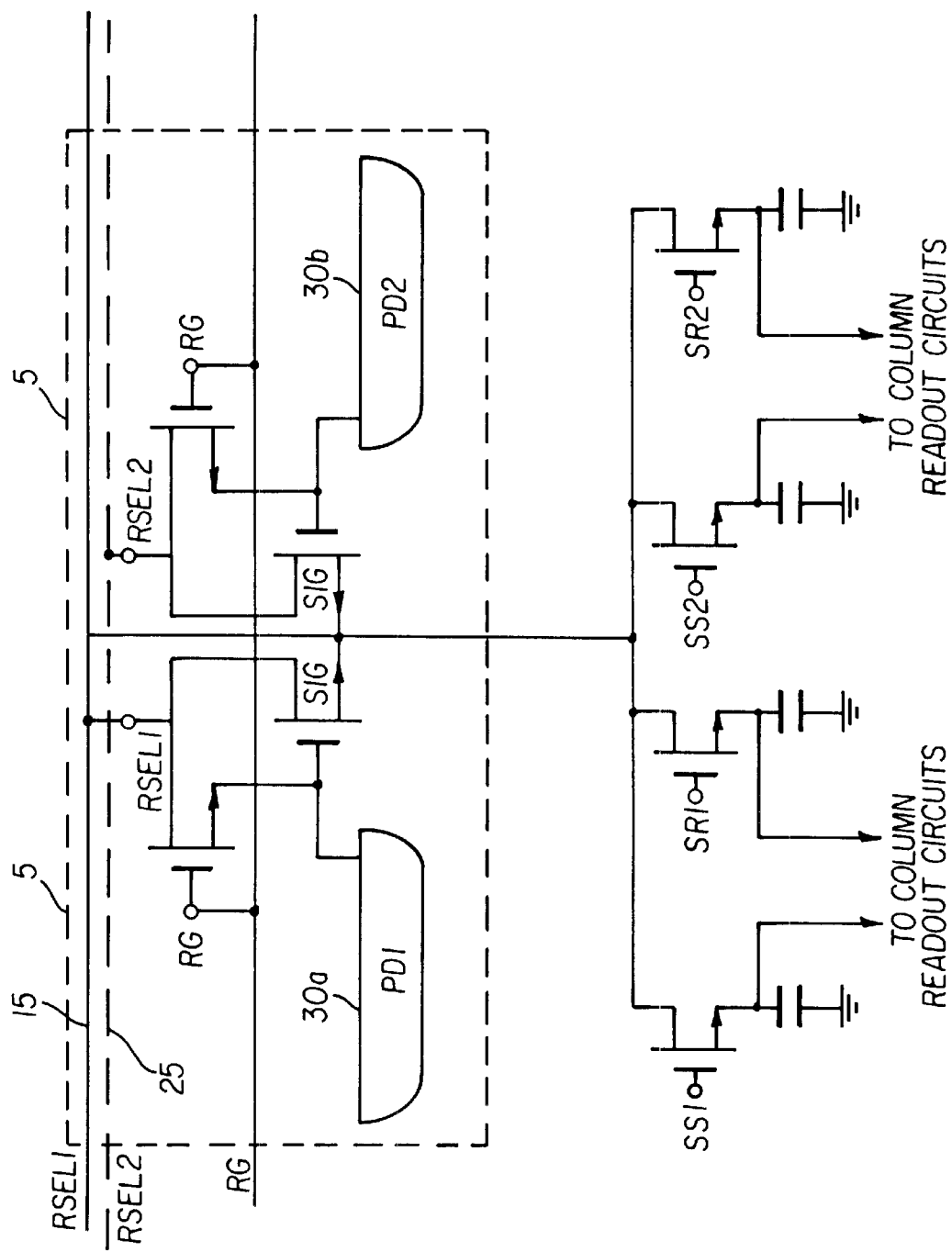

It should be noted that this same concept of two separate select signal lines per row and a shared output node and output signal line can be applied to any specific pixel design where readout is done a row at a time to a column output signal line by actively selecting a specific row for readout. This operation can be described conceptually as column interlaced sample and hold per row operation. Another example of the use of this concept is provided in FIG. 2d. In this case, the pixel select mechanism is a switched supply row select as described by Guidash in U.S. Pat. No. 5,949,061, issued on Sep. 7, 1999. In this case, two switched supply signal lines are provided for each row. One select signal line is applied to all odd pixels in the row and one select signal line is applied to all even pixels in the row.

Figure 6A:
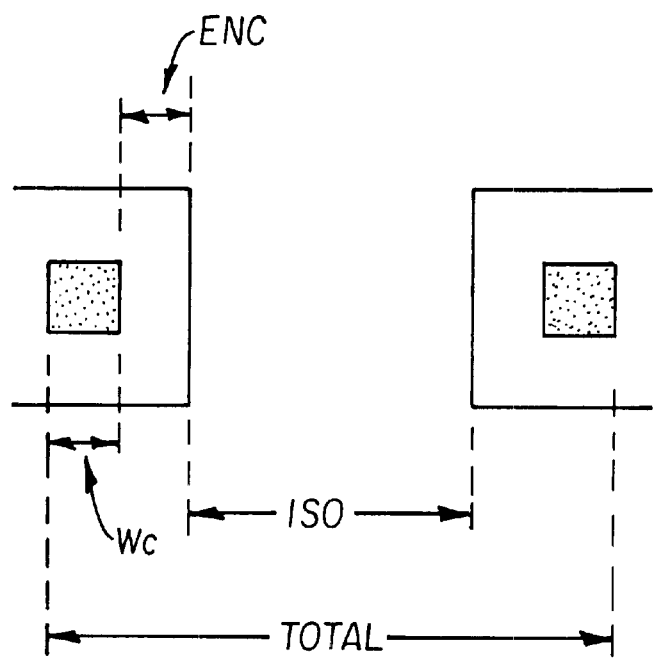
FIG. 6a is a spatial diagram of prior art pixels.
Figure 6B:
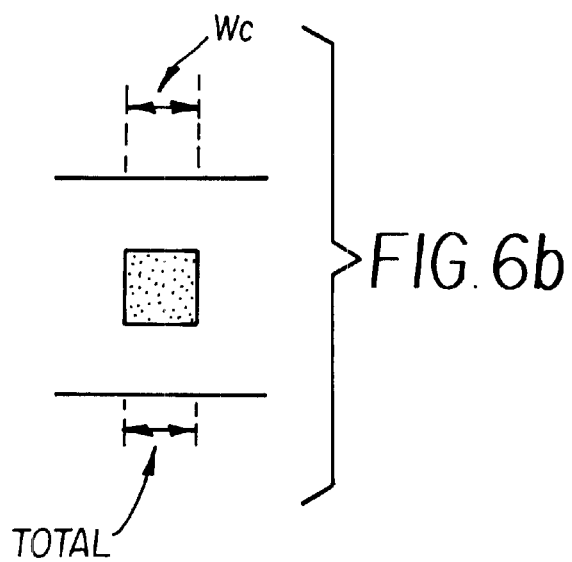
FIG. 6b is a spatial diagram of pixels of the present invention.

The architecture of the present invention provides a high fill factor, or a smaller pixel compared to prior art, since the output node and column output signal line is shared between at least two row adjacent pixels. The benefits of this can be seen by examining FIG. 6. FIG. 6a shows a region in between two row adjacent pixels of prior art pixels. FIG. 6b shows the same region using the pixel architecture of this invention. The area in one dimension that can be saved by sharing the output node and column signal line is given by equation 1, where Wc is the minimum contact size, ENC1 is the minimum enclosure of a contact by active area, and ISO is the minimum active area space.

$$\text{Distanced Saved} = (2Wc + 2ENC1 + ISO) - (Wc) = Wc + 2ENC1 + ISO \quad (1)$$

This can be substantial. For example in a 0.5 um CMOS process this is approximately 1.8 um, and for a 0.35 um CMOS process this is approximately 1.4 um. In addition, this new architecture provides fewer column output signal lines and thus creates a larger effective aperture of the pixel since the distance between adjacent metal lines in the array is increased. One extra metal line per row is required to provide a second row select signal line per row, but this takes up much less area than that occupied by the separate output node regions and output signal lines since the two row select signal lines can be routed over top of each other in different metal levels. There is one extra timing and control signals required and two additional transistors per column required. However, these do not impact the pixel or image array area since they are incorporated in the CMOS logic outside of the image array. This architecture also has a temporal displacement of image capture of odd and even pixels within a given row. This time is very short however, (especially compared to the row to row temporal displacement), on the order of a few hundred nanoseconds, and will not produce any image capture artifacts. Because there is an extra sequence of sample and holds, (SHR and SHS strobes), the minimum line time is slightly longer for this new architecture, which will incrementally diminish the maximum frame rate for video applications.

The invention has been described in detail with particular reference to certain preferred embodiments thereof, but it will be understood that variations and modifications can be effected within the spirit and scope of the invention.

PARTS LIST 5 pixels
10a floating diffusion 1

10*b* floating diffusion 2
15 row select 1
20*a* column circuit
20*b* column circuit
25 row select 2
30*a* photodetector 1
30*b* photodetector 2
APS active pixel sensors
PPS passive pixel sensors
PD photodetector
TG transfer gate
FD floating diffusion
RG reset gate
SIG signal transistor
P photodiode
RSEL row select gate
4T four transistor pixels

What is claimed is:

1. An image sensor comprising:
   (a) a plurality pixels arranged in rows and columns;
   (b) at least two adjacent pixels in the same row each having a photodetector;
   (c) a row select mechanism that allows independent selection of the adjacent pixels; and
   (d) a common output signal node for the two adjacent pixels.

2. The image sensor as in claim 1, wherein the row select mechansim is a MOS transistor with two select signal lines connected to alternate pixels in the same row.

3. The image sensor as in claim 1, wherein the row select mechanism is a switched supply with two select signal lines connected to alternate pixels in the same row.

4. The image sensor as in claim 1 further comprising a sample and hold circuit that places reset and signal levels in circuits associated with each column.

5. An active pixel sensor comprising:
   (a) a plurality pixels arranged in rows and columns;
   (b) at least two adjacent pixels in the same row each having a photodetector with a reset mechanism;
   (c) a row select mechanism that allows independent selection of the adjacent pixels; and
   (d) a common output signal node for the two adjacent pixels.

6. The image sensor as in claim 5, wherein the row select mechansim is a MOS transistor with two select signal lines connected to alternate pixels in the same row.

7. The image sensor as in claim 5, wherein the row select mechanism is a switched supply with two select signal lines connected to alternate pixels in the same row.

* * * * *